US012041829B2

United States Patent
Shui et al.

(10) Patent No.: US 12,041,829 B2
(45) Date of Patent: Jul. 16, 2024

(54) CHIP-ON-FILM STRUCTURE, DISPLAY APPARATUS AND METHOD FOR MANUFACTURING SAME

(71) Applicants: Chengdu BOE Optoelectronics Technology Co., Ltd., Sichuan (CN); BOE Technology Group Co., Ltd., Beijing (CN)

(72) Inventors: Yudan Shui, Beijing (CN); Yanping Ren, Beijing (CN); Lian Xiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 110 days.

(21) Appl. No.: 17/437,012

(22) PCT Filed: Feb. 8, 2021

(86) PCT No.: PCT/CN2021/075948
§ 371 (c)(1),
(2) Date: Sep. 7, 2021

(87) PCT Pub. No.: WO2021/196898
PCT Pub. Date: Oct. 7, 2021

(65) Prior Publication Data
US 2023/0180548 A1    Jun. 8, 2023

(30) Foreign Application Priority Data

Apr. 2, 2020    (CN) .......................... 202010253696.4

(51) Int. Cl.
*H10K 59/131*    (2023.01)
*H05K 1/18*    (2006.01)
*H10K 59/12*    (2023.01)

(52) U.S. Cl.
CPC ........... *H10K 59/131* (2023.02); *H05K 1/189* (2013.01); *H10K 59/1201* (2023.02); *H05K 2201/10128* (2013.01)

(58) Field of Classification Search
CPC ..................... H10K 59/1201; H10K 59/131
See application file for complete search history.

(56) References Cited

U.S. PATENT DOCUMENTS

2015/0357308 A1\* 12/2015 Qi ...................... G02F 1/13454
257/668
2019/0041681 A1\* 2/2019 Lai ...................... H01L 23/4985
(Continued)

FOREIGN PATENT DOCUMENTS

| CN | 106783880 A | 5/2017 |
| CN | 107039377 A | 8/2017 |

(Continued)

OTHER PUBLICATIONS

CN202010253696.4 first office action.

*Primary Examiner* — Douglas M Menz
(74) *Attorney, Agent, or Firm* — IPro, PLLC

(57) ABSTRACT

The present disclosure provides a chip-on-film structure, a display apparatus and a methods for manufacturing the display apparatus. The display apparatus includes: a base substrate; a bonding structure disposed on the base substrate; and a chip-on-film COF structure, wherein the COF structure and a side of the bonding structure that is away from the base substrate are clamped with each other, and the COF structure is bonded to the side of the bonding structure that is away from the base substrate; wherein when the COF structure and the bonding structure are bonded, the COF structure contacts both a first surface and a second surface of the bonding structure at the side of the bonding structure that is away from the base substrate, wherein the first surface is (Continued)

parallel to the base substrate, and the second surface is at an angle with the first surface.

19 Claims, 5 Drawing Sheets

(56) References Cited

U.S. PATENT DOCUMENTS

| | | |
|---|---|---|
| 2021/0143247 A1 | 5/2021 | Wu et al. |
| 2021/0208644 A1 | 7/2021 | Wang et al. |

FOREIGN PATENT DOCUMENTS

| | | |
|---|---|---|
| CN | 108133669 A | 6/2018 |
| CN | 207781088 U | 8/2018 |
| CN | 110111682 A | 8/2019 |
| CN | 110828480 A | 2/2020 |
| CN | 110867462 A | 3/2020 |
| CN | 110888276 A | 3/2020 |
| CN | 111430421 A | 7/2020 |
| JP | 2019101224 A | 6/2019 |

* cited by examiner

CHIP-ON-FILM STRUCTURE, DISPLAY APPARATUS AND METHOD FOR MANUFACTURING SAME

CROSS REFERENCE TO RELATED APPLICATION

This application is a 371 of PCT Patent Application Serial No. PCT/CN2021/075948, filed on Feb. 8, 2021, which claims priority to Chinese Patent Application No. 202010253696.4, filed on Apr. 2, 2020 and entitled "DISPLAY APPARATUS AND METHOD FOR MANUFACTURING SAME", the entire contents of both of which are herein incorporated by reference.

TECHNICAL FIELD

The present disclosure relates to the field of display technologies, and in particular relates to a chip-on-film structure, a display apparatus and a method for manufacturing the display apparatus.

BACKGROUND

Organic light-emitting diode (OLED) display devices have gained extensive development in current display technologies due to their features of high contrast, high luminance, low power consumption and flexible folding.

SUMMARY

The present disclosure provides a chip-on-film structure, a display apparatus and a method for manufacturing the display apparatus.

According to a first aspect, there is provided a display apparatus. The display apparatus includes: a base substrate; a bonding structure disposed on the base substrate, and a chip-on-film COF structure bonded to a side of the bonding structure that is away from the base substrate, wherein the COF structure and the side of the bonding structure that is away from the base substrate are clamped with each other; and when the COF structure and the bonding structure are bonded, the COF structure contacts both a first surface and a second surface of the bonding structure at the side of the bonding structure that is away from the base substrate, wherein the first surface is parallel to the base substrate, and the second surface is at an angle with the first surface.

Optionally, the bonding structure includes a plurality of bonding pattern layers that are sequentially laminated on the base substrate and first insulating layers respectively disposed between each two adjacent bonding pattern layers;
the COF structure includes a plurality of COF layers that are sequentially laminated and second insulating layers respectively disposed between each two adjacent COF layers;
the plurality of bonding pattern layers is in one-to-one correspondence with the plurality of COF layers, and a side of each bonding pattern layer that is away from the base substrate is bonded with a corresponding COF layer; and
edges at the side of the plurality of bonding pattern layers that is away from the base substrate are arranged like a stair-step; the first surface includes at least a part of an area of a surface of the bonding pattern layer that is away from the base substrate; and the second surface includes at least one side surface of at least one bonding pattern layer.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

Optionally, a first orthographic projection is within a second orthographic projection, and an area of the first orthographic projection is smaller than an area of the second orthographic projection; and
the first orthographic projection is an orthographic projection of the $(i+1)^{th}$ bonding pattern layer on the base substrate, and the second orthographic projection is an orthographic projection of the $i^{th}$ bonding pattern layer on the base substrate.

Optionally, the plurality of bonding pattern layers comprises a first bonding pattern layer and at least one second bonding pattern layer;
the at least one second bonding pattern layer is disposed between the base substrate and the first bonding pattern layer; and the second bonding pattern layer comprises a first sub-pattern and a second sub-pattern spaced from each other, wherein both the first sub-pattern and the second sub-pattern are bonded with a COF layer corresponding to the second bonding pattern layer; and
a side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first second sub-pattern of the $i^{th}$ bonding pattern layer protrudes beyond the $(i+1)^{th}$ bonding pattern layer.

Optionally, for a first insulating layer between the $i^{th}$ bonding pattern layer and the $(i+1)^{th}$ bonding pattern layer, at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

Optionally, for the first insulating layer between the $i^{th}$ bonding pattern layer and the $(i+1)^{th}$ bonding pattern layer, at each of the at least one side, the first insulating layer protrudes beyond the $(i+1)^{th}$ bonding pattern layer for a length of smaller than or equal to 60 microns.

Optionally, the length is larger than or equal to 20 microns and is smaller than or equal to 40 microns.

Optionally, the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin; and
the display apparatus further comprises a plurality of leads disposed on the base substrate, the at least one first pin of the bonding pattern layer is in one-to-one correspondence with the plurality of leads, and the first pin is connected to a corresponding lead.

Optionally, the display apparatus further comprises a connecting structure disposed on the base substrate, wherein at least part of the at least one first pin is connected to a lead corresponding to the first pin through the connecting structure.

Optionally, the display apparatus further comprises:
a flexible printed circuit FPC bonded with the COF structure, wherein a side of the COF structure away from the FPC is bonded with the bonding structure.

According to a second aspect, there is provided a method for manufacturing a display apparatus. The method includes:

providing a base substrate and a chip-on-film COF structure;
forming a bonding structure on the base substrate; and
bonding the COF structure with a side of the bonding structure that is away from the base substrate, wherein the COF structure and the side of the bonding structure that is away from the base substrate are clamped with each other; wherein when the COF structure and the bonding structure are bonded, the COF structure contacts both a first surface and a second surface of the bonding structure at the side of the bonding structure that is away from the base substrate, wherein the first surface is parallel to the base substrate, and the second surface is at an angle with the first surface.

Optionally, forming the bonding structure on the base substrate includes: forming a plurality of bonding pattern layers that are sequentially laminated on the base substrate and first insulating layers respectively disposed between each two adjacent bonding pattern layers, wherein edges at the side of the plurality of bonding pattern layers that is away from the base substrate are arranged like a stair-step; the first surface includes at least a part of an area of a surface of the bonding pattern layer that is away from the base substrate; and the second surface includes at least one side surface of at least one bonding pattern layer;

the COF structure includes a plurality of COF layers that are sequentially laminated and second insulating layers respectively disposed between each two adjacent COF layers; the plurality of bonding pattern layers is in one-to-one correspondence with the plurality of COF layers; and bonding the COF structure with the side of the bonding structure that is away from the base substrate includes:

bonding a side of each bonding pattern layer that is away from the base substrate with a corresponding COF layer.

Optionally, the bonding pattern layer comprises at least one first pin; the COF layer comprises at least one second pin; the first pin of the bonding pattern layer is in one-to-one correspondence with the second pin of the COF layer;

bonding the side of each bonding pattern layer that is away from the base substrate with the corresponding COF layer comprises:

bonding a side of each first pin away from the base substrate with a corresponding second pin; and the method further comprises:

forming a plurality of leads on the base substrate, wherein the at least one first pin of the bonding pattern layer is in one-to-one correspondence with the plurality of leads, and the first pin is connected to a corresponding lead.

Optionally, the method further comprises:
forming a connecting structure on the base substrate,
wherein at least part of the at least one first pin is connected to a lead corresponding to the first pin through the connecting structure.

Optionally, the method further comprises:
providing a flexible printed circuit FPC; and
bonding the COF structure with the FPC, wherein a side of the COF structure away from the FPC is bonded with the bonding structure.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

Optionally, a first orthographic projection is within a second orthographic projection, and an area of the first orthographic projection is smaller than an area of the second orthographic projection; and
the first orthographic projection is an orthographic projection of the $(i+1)^{th}$ bonding pattern layer on the base substrate, and the second orthographic projection is an orthographic projection of the $i^{th}$ bonding pattern layer on the base substrate.

Optionally, the plurality of bonding pattern layers comprises a first bonding pattern layer and at least one second bonding pattern layer;
the at least one second bonding pattern layer is disposed between the base substrate and the first bonding pattern layer; and the second bonding pattern layer comprises a first sub-pattern and a second sub-pattern spaced from each other, wherein both the first sub-pattern and the second sub-pattern are bonded with a COF layer corresponding to the second bonding pattern layer; and
a side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first second sub-pattern of the $i^{th}$ bonding pattern layer) protrudes beyond the $(i+1)^{th}$ bonding pattern layer.

Optionally, for a first insulating layer between the $i^{th}$ bonding pattern layer and the $(i+1)^{th}$ bonding pattern layer, at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

Optionally, for the first insulating layer between the $i^{th}$ bonding pattern layer and the $(i+1)^{th}$ bonding pattern layer, at each of the at least one side, the first insulating layer protrudes beyond the $(i+1)^{th}$ bonding pattern layer for a length of smaller than or equal to 60 microns.

Optionally, the length is larger than or equal to 20 microns and is smaller than or equal to 40 microns.

Optionally, a material of the base substrate includes a flexible material.

According to a third aspect, there is provided a display substrate. The display substrate includes:
a base substrate; and
a bonding structure disposed on the base substrate, wherein
a side of the bonding structure that is away from the base substrate is configured to be bonded with a chip-on-film COF structure, and the side of the bonding structure that is away from the base substrate and the COF structure are clamped with each other;
the bonding structure includes a first surface and a second surface that are away from the base substrate; an included angle is formed between the first surface and the second surface; and when the COF structure and the bonding structure are bonded, both the first surface and the second surface contact the COF structure.

Optionally, the bonding structure includes a plurality of bonding pattern layers that are sequentially laminated on the base substrate and first insulating layers respectively disposed between each two adjacent bonding pattern layers;
the COF structure includes a plurality of COF layers that are sequentially laminated and second insulating layers respectively disposed between each two adjacent COF layers;
the plurality of bonding pattern layers is in one-to-one correspondence with the plurality of COF layers, and a side of each bonding pattern layer that is away from the base substrate is bonded with a corresponding COF layer; and edges at the side of the plurality of bonding pattern layers that is away from the base substrate are arranged like a stair-step; the first surface includes at least a part of an area of a surface of the bonding pattern layer that is away from the base substrate; and the second surface includes at least one side surface of at least one bonding pattern layer.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

Optionally, a first orthographic projection is within a second orthographic projection, and an area of the first orthographic projection is smaller than an area of the second orthographic projection; and the first orthographic projection is an orthographic projection of the $(i+1)^{th}$ bonding pattern layer on the base substrate, and the second orthographic projection is an orthographic projection of the $i^{th}$ bonding pattern layer on the base substrate.

Optionally, the plurality of bonding pattern layers comprises a first bonding pattern layer and at least one second bonding pattern layer;

the at least one second bonding pattern layer is disposed between the base substrate and the first bonding pattern layer; and the second bonding pattern layer comprises a first sub-pattern and a second sub-pattern spaced from each other, wherein both the first sub-pattern and the second sub-pattern are bonded with a COF layer corresponding to the second bonding pattern layer; and a side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first second sub-pattern of the $i^{th}$ bonding pattern layer protrudes beyond the $(i+1)^{th}$ bonding pattern layer.

Optionally, for a first insulating layer between the $i^{th}$ bonding pattern layer and the $(i+1)^{th}$ bonding pattern layer, at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

Optionally, for the first insulating layer between the $i^{th}$ bonding pattern layer and the $(i+1)^{th}$ bonding pattern layer, at each of the at least one side, the first insulating layer protrudes beyond the $(i+1)^{th}$ bonding pattern layer for a length of smaller than or equal to 60 microns.

Optionally, the length is larger than or equal to 20 microns and is smaller than or equal to 40 microns.

Optionally, the bonding pattern layer comprises at least one first pin; the COF layer comprises at least one second pin;

the first pin of the bonding pattern layer is in one-to-one correspondence with the second pin of the COF layer; and a side of each first pin away from the base substrate is bonded with a corresponding second pin; and the display substrate further comprises a plurality of leads disposed on the base substrate, the at least one first pin of the bonding pattern layer is in one-to-one correspondence with the plurality of leads, and the first pin is connected to a corresponding lead.

Optionally, the display substrate further comprises a connecting structure disposed on the base substrate, wherein at least part of the at least one first pin is connected to a lead corresponding to the first pin through the connecting structure.

Optionally, a material of the base substrate includes a flexible material.

According to a fourth aspect, a method for manufacturing a display substrate is provided. The method includes:

providing a base substrate; and forming a bonding structure on the base substrate, wherein a side of the bonding structure that is away from the base substrate is configured to be bonded with a chip-on-film COF structure, and the side of the bonding structure that is away from the base substrate and the COF structure are clamped with each other;

the bonding structure includes a first surface and a second surface that are away from the base substrate; an included angle is formed between the first surface and the second surface; and when the COF structure and the bonding structure are bonded, both the first surface and the second surface contact the COF structure.

Optionally, forming the bonding structure on the base substrate includes: forming a plurality of bonding pattern layers that are sequentially laminated on the base substrate and first insulating layers respectively disposed between each two adjacent bonding pattern layers, wherein edges at the side of the plurality of bonding pattern layers that is away from the base substrate are arranged like a stair-step; the first surface includes at least a part of an area of a surface of the bonding pattern layer that is away from the base substrate; and the second surface includes at least one side surface of at least one bonding pattern layer;

the COF structure includes a plurality of COF layers that are sequentially laminated and second insulating layers respectively disposed between each two adjacent COF layers, wherein the plurality of bonding pattern layers is in one-to-one correspondence with the plurality of COF layers; and a side of each bonding pattern layer that is away from the base substrate is bonded with a corresponding COF layer.

Optionally, the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin; and the method further comprises:

forming a plurality of leads on the base substrate, wherein the at least one first pin of the bonding pattern layer is in one-to-one correspondence with the plurality of leads, and the first pin is connected to a corresponding lead.

Optionally, the method further comprises:

forming a connecting structure on the base substrate, wherein at least part of the at least one first pin is connected to a lead corresponding to the first pin through the connecting structure.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

Optionally, a first orthographic projection is within a second orthographic projection, and an area of the first orthographic projection is smaller than an area of the second orthographic projection; and the first orthographic projection is an orthographic projection of the $(i+1)^{th}$ bonding pattern layer on the base substrate, and the second orthographic projection is an orthographic projection of the $i^{th}$ bonding pattern layer on the base substrate.

Optionally, the plurality of bonding pattern layers comprises a first bonding pattern layer and at least one second bonding pattern layer;

the at least one second bonding pattern layer is disposed between the base substrate and the first bonding pattern layer; and the second bonding pattern layer comprises a first sub-pattern and a second sub-pattern spaced from each other, wherein both the first sub-pattern and the second sub-pattern are bonded with a COF layer corresponding to the second bonding pattern layer; and a side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first second sub-pattern of the $i^{th}$ bonding pattern layer protrudes beyond the $(i+1)^{th}$ bonding pattern layer.

Optionally, for a first insulating layer between the $i^{th}$ bonding pattern layer and the $(i+1)^{th}$ bonding pattern layer, at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

Optionally, for the first insulating layer between the $i^{th}$ bonding pattern layer and the $(i+1)^{th}$ bonding pattern layer, at each of the at least one side, the first insulating layer protrudes beyond the $(i+1)^{th}$ bonding pattern layer for a length of smaller than or equal to 60 microns.

Optionally, the length is larger than or equal to 20 microns and is smaller than or equal to 40 microns.

Optionally, a material of the base substrate includes a flexible material.

According to a fifth aspect, a chip-on-film COF structure is provided. The COF structure includes a third surface and a fourth surface, wherein the third surface is at an angle with the fourth surface; the COF structure is configured to be bonded with a bonding structure that is away from a base substrate; the bonding structure is disposed on the base substrate; the COF structure and the side of the bonding structure that is away from the base substrate are clamped with each other; and when the COF structure and the bonding structure are bonded, both the third surface and the fourth surface contact the bonding structure.

Optionally, the bonding structure includes a plurality of bonding pattern layers that are sequentially laminated on the base substrate and first insulating layers respectively disposed between each two adjacent bonding pattern layers;

the COF structure includes a plurality of COF layers that are sequentially laminated and second insulating layers respectively disposed between each two adjacent COF layers;

the plurality of bonding pattern layers is in one-to-one correspondence with the plurality of COF layers, and a side of each bonding pattern layer that is away from the base substrate is bonded with a corresponding COF layer; and edges at the side of the plurality of bonding pattern layers that is away from the base substrate are arranged like a stair-step; the first surface includes at least a part of an area of a surface of the bonding pattern layer that is away from the base substrate; and the second surface includes at least one side surface of at least one bonding pattern layer.

Optionally, among the plurality of COF layers, for an $i^{th}$ COF layer and an $(i+1)^{th}$ COF layer arranged along a target direction, the $i^{th}$ COF layer protrudes beyond the $(i+1)^{th}$ COF layer, where $i \geq 1$, and the target direction is a direction away from a side of the COF structure for bonding with the bonding structure.

Optionally, a third orthographic projection is within a fourth orthographic projection, and an area of the third orthographic projection is smaller than that of the fourth orthographic projection; and the third orthographic projection is an orthographic projection of the $i^{th}$ bonding pattern layer on a reference plane, and the fourth orthographic projection is an orthographic projection of the $(i+1)^{th}$ bonding pattern layer on the reference plane, the reference plane being parallel to the COF layers.

Optionally, the plurality of COF layers includes a first COF layer and at least one second COF layer;

the at least one second COF layer is disposed on a side of the first COF layer that is configured to be bonded with the bonding structure; and the second COF layer includes a third sub-pattern and a fourth sub-pattern spaced from each other, wherein both the third sub-pattern and the fourth sub-pattern are bonded with a bonding pattern layer corresponding to the second COF layer; and the $(i+1)^{th}$ COF layer protrudes beyond a side of the third sub-pattern in the $i^{th}$ COF layer that is close to the fourth sub-pattern; and the $(i+1)^{th}$ COF layer protrudes beyond a side of the fourth sub-pattern in the $i^{th}$ COF layer that is away from the third sub-pattern.

Optionally, for the second insulating layer between the $i^{th}$ COF layer and the $(i+1)^{th}$ COF layer, at at least one side of the $i^{th}$ COF layer, the $(i+1)^{th}$ COF layer protrudes beyond the second insulating layer, and the second insulating layer protrudes beyond the $i^{th}$ COF layer.

Optionally, for the second insulating layer between the $i^{th}$ COF layer and the $(i+1)^{th}$ COF layer, at each of the at least one side, the second insulating layer protrudes beyond the $i^{th}$ COF layer for a length of smaller than or equal to 60 microns.

Optionally, the length is larger than or equal to 20 microns and is smaller than or equal to 40 microns.

Optionally, the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin.

Optionally, the COF structure is bonded with a flexible printed circuit FPC, wherein a side of the COF structure away from the FPC is bonded with the bonding structure.

According to a sixth aspect, a method for manufacturing a chip-on-film COF structure is provided. The method includes:

manufacturing a chip-on-film COF structure including a third surface and a fourth surface, wherein the third surface is at an angle with the fourth surface; the COF structure is configured to be bonded with a bonding structure that is away from a base substrate; the bonding structure is disposed on the base substrate; the COF structure and the side of the bonding structure that is away from the base substrate are clamped with each other; and when the COF structure and the bonding structure are bonded, both the third surface and the fourth surface contact the bonding structure.

Optionally, the bonding structure includes a plurality of bonding pattern layers that are sequentially laminated on the base substrate and first insulating layers respectively disposed between each two adjacent bonding pattern layers;

manufacturing the COF structure including the third surface and the fourth surface includes: forming a plurality of COF layers that are sequentially laminated and second insulating layers respectively disposed between each two adjacent COF layers, wherein the plurality of bonding pattern layers is in one-to-one correspondence with the plurality of COF layers, and a side of each bonding pattern layer that is away from the base substrate is bonded with a corresponding COF layer; and edges at the side of the plurality of bonding pattern layers that is away from the base substrate are arranged like a stair-step; the third surface includes at least a partial area of a side of the COF structure to be bonded with the bonding structure; and the fourth surface includes at least one side surface of at least one COF layer.

Optionally, among the plurality of COF layers, for an $i^{th}$ COF layer and an $(i+1)^{th}$ COF layer arranged along a first direction, the $i^{th}$ COF layer protrudes beyond the $(i+1)^{th}$ COF layer, where $i \geq 1$, and the first direction is a direction away from a side of the COF structure for bonding with the bonding structure.

Optionally, a third orthographic projection is within a fourth orthographic projection, and an area of the third orthographic projection is smaller than that of the fourth orthographic projection; and the third orthographic projection is an orthographic projection of the $i^{th}$ bonding pattern layer on a reference plane, and the fourth orthographic projection is an orthographic projection of the $(i+1)^{th}$ bonding pattern layer on the reference plane, the reference plane being parallel to the COF layers.

Optionally, the plurality of COF layers includes a first COF layer and at least one second COF layer;

the at least one second COF layer is disposed on a side of the first COF layer that is configured to be bonded with the bonding structure; and the second COF layer includes a third sub-pattern and a fourth sub-pattern spaced from each other, wherein both the third sub-pattern and the fourth sub-pattern are bonded with a bonding pattern layer corresponding to the second COF layer; and the $(i+1)^{th}$ COF layer protrudes beyond a side of the third sub-pattern in the $i^{th}$ COF layer that is close to the fourth sub-pattern; and the $(i+1)^{th}$ COF layer protrudes beyond a side of the fourth sub-pattern in the $i^{th}$ COF layer that is away from the third sub-pattern.

Optionally, for the second insulating layer between the $i^{th}$ COF layer and the $(i+1)^{th}$ COF layer, at at least one side of the $i^{th}$ COF layer, the $(i+1)^{th}$ COF layer protrudes beyond the second insulating layer, and the second insulating layer protrudes beyond the $i^{th}$ COF layer.

Optionally, for the second insulating layer between the $i^{th}$ COF layer and the $(i+1)^{th}$ COF layer, at each of the at least one side, the second insulating layer protrudes beyond the $i^{th}$ COF layer for a length of smaller than or equal to 60 microns.

Optionally, the length is larger than or equal to 20 microns and is smaller than or equal to 40 microns.

Optionally, the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin.

Optionally, the COF structure is bonded with a flexible printed circuit FPC, wherein a side of the COF structure away from the FPC is bonded with the bonding structure.

DETAILED DESCRIPTION

In order to make the principles, technical solutions and advantages of the present disclosure clearer, the following describes the present disclosure in detail in conjunction with specific embodiments and with reference to the accompanying drawings.

It should be noted that the technical and scientific terms as used in the embodiments of the present disclosure have the meanings as commonly understood by those of ordinary skill in the art of the present disclosure, unless otherwise defined. The words "first", "second" and similar terms used in the present disclosure do not denote any order, quantity, or importance, and are merely used to distinguish different components. The word "comprise", "containing" or similar terms mean that elements or objects appearing before the term cover the listed elements or objects and its equivalents appearing after the term while other elements or objects are not excluded. The word "connected" or "coupled" and similar terms are not limited to physical or mechanical connections, and may include electrical connection and the connection may be direct or indirect. "Upper", "lower", "left", "right" and the like are only used to indicate the relative positional relationship, and when the absolute position of a described object changes, the relative positional relationship may also change accordingly.

Figure 1:
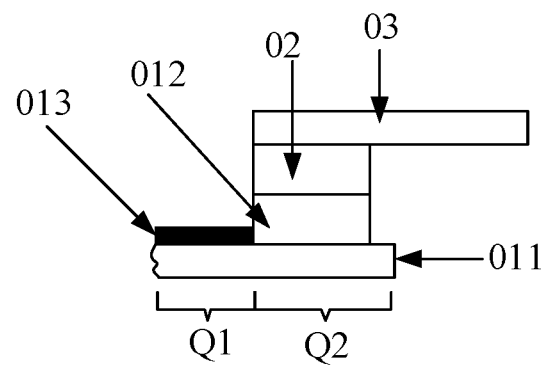
FIG. 1 is a schematic structural diagram of a display apparatus provided by an embodiment of the present disclosure.

FIG. 1 is a schematic structural diagram of a display apparatus provided by an embodiment of the present disclosure. As shown in FIG. 1, the display apparatus includes a display substrate (including a base substrate 011 and a bonding structure 012), a chip-on-film (COF) 02 and a flexible printed circuit (FPC) 03. The base substrate 011 includes a display area Q1 (FIG. 1 shows only a part of the display area), and a bonding area Q2 disposed on a side of the display area Q1. The bonding structure 012 is disposed in the bonding area Q2. The COF structure 02 is bonded with the side of the bonding structure 012 that is away from the base substrate 011, and the COF structure 02 is also bonded with the FPC 03.

Figure 2:
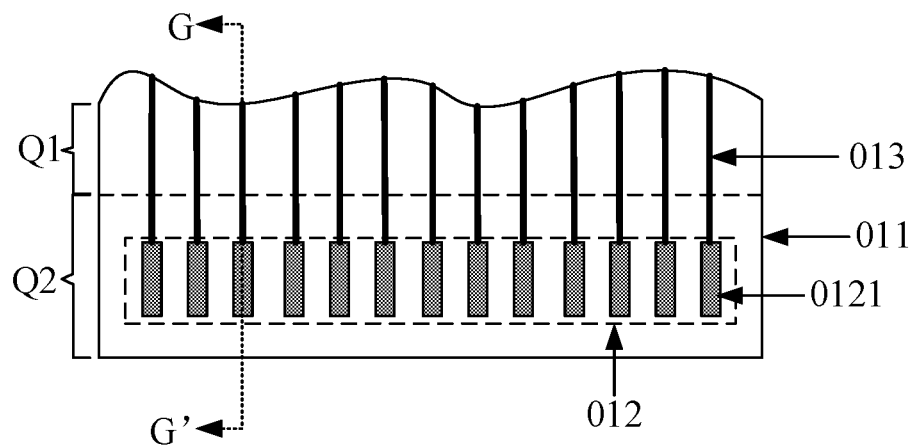
FIG. 2 is a partial top view of a display substrate in FIG. 1 provided by an embodiment of the present disclosure.

FIG. 2 is a partial top view of a display substrate in FIG. 1 provided by an embodiment of the present disclosure. FIG. 1 shows a structure of a section GG' in FIG. 2. As can be seen from FIG. 1 and FIG. 2, the display substrate further includes a plurality of leads 013 disposed on the base substrate 011, and the leads 13 extend to the bonding area Q2 from the display area Q1 of the base substrate 011. The bonding structure 012 includes a plurality of first pins 0121 that is in one-to-one correspondence with the plurality of leads 013, each lead 013 being connected to the corresponding first pin 0121. In this way, each lead 013 may be connected to the COF structure 02 through the bonding structure 012, and may also be connected to the FPC 03 through the bonding structure 012 and the COF structure 02.

Figure 3:
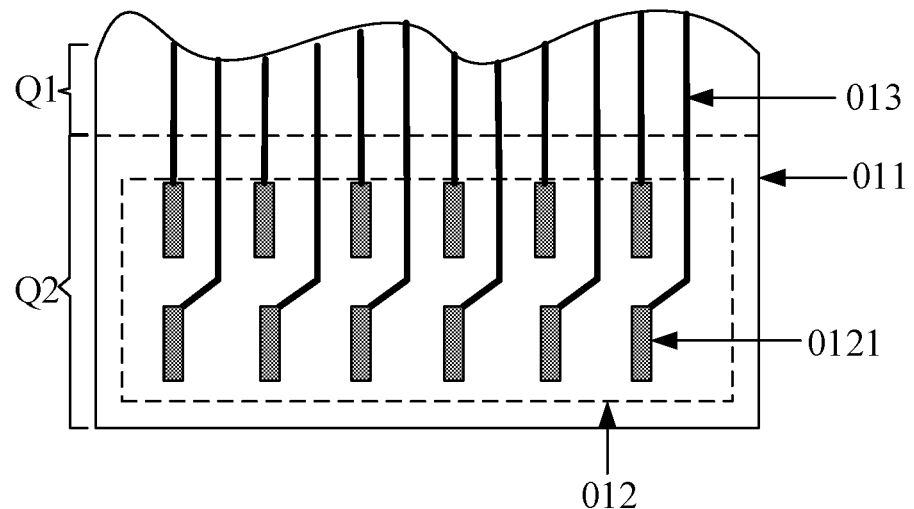
FIG. 3 is a partial top view of another display substrate provided by an embodiment of the present disclosure.

As a size of the display apparatus becomes larger and larger, there are more and more leads 013 used in the display apparatus. If these leads 013 all extend to the bonding area Q2, an arrangement width between these leads 013 is relatively large, and an arrangement width between the first pins 0121 in the bonding structure 012 is also relatively large. Generally, in order to reduce the arrangement widths of the leads 013 and the first pins 0121, as shown in FIG. 3, a plurality of first pins 0121 may be arranged in two rows, with a certain gap being formed between the two rows of first pins 0121. The first pins 0121 of the first row may be directly connected to the corresponding leads 013, and the leads 013 corresponding to the first pins 0121 of the second row need to pass through the first pins 0121 of the first row and be connected to the first pins 0121 of the second row.

However, regardless of whether the first pins 0121 are arranged in an arrangement mode shown in FIG. 2 or arranged in an arrangement mode shown in FIG. 3, a surface of each first pin 0121 in the bonding structure 012 that is away from the base substrate (parallel to the base substrate) contacts the COF structure 02 when the bonding structure 012 is bonded with the COF structure 02. However, the other surface of the bonding structure 012 away from the base substrate (such as a side surface of each first pin 0121, which is perpendicular to the base substrate) is not in contact with the COF structure 02. In addition, a position where the bonding area Q2 in the display substrate is disposed is uneven in the presence of the first pins 0121. When the COF structure 02 is bonded with the bonding structure 012, respective positions of the bonding area Q2 in the display substrate are not uniformly stressed. The position where the bonding area Q2 is disposed will generate a stress, which will damage components at this position (for example, the leads 013 at this position will break), thereby affecting the normal use of the display apparatus.

An embodiment of the present disclosure provides another display apparatus. The display apparatus can reduce the risk of component damage at the position of the bonding area in the display substrate.

Figure 4:
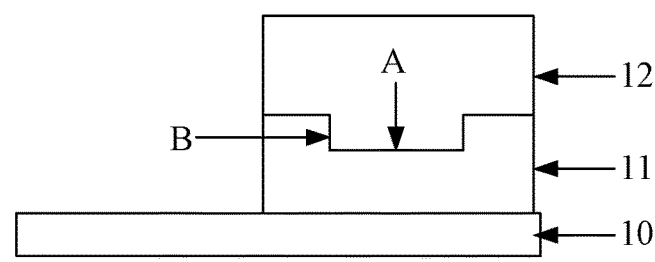
FIG. 4 is a schematic structural diagram of another display apparatus provided by an embodiment of the present disclosure.

In an exemplary embodiment, FIG. 4 is a schematic structural diagram of another display apparatus provided by an embodiment of the present disclosure. As shown in FIG. 4, the display apparatus includes a base substrate 10, a bonding structure 11 and a COF structure 12. The bonding structure 11 is disposed on the base substrate 10. The COF structure 12 is bonded with the side of the bonding structure 11 that is away from the base substrate 10.

The COF structure 12 and the side of the bonding structure 11 that is away from the base substrate 10 are clamped with each other. When the COF structure and the bonding structure 11 are bonded, the COF structure 12 contacts both a first surface A and a second surface B at the side of the bonding structure 11 that is away from the base substrate 10. The first surface A is parallel to the base substrate 10 (e.g., the first surface A is parallel to a surface of the base substrate 10 on the side where the bonding structure 11 is provided), and an included angle is formed between the second surface B and the first surface A. For example, the second surface B is perpendicular or inclined to the first surface A. Since the COF structure 12 and the bonding structure 11 are clamped, the COF structure 12 may include a third surface (not shown in FIG. 4) and a fourth surface (not shown in FIG. 4). The third surface is at an angle with the fourth surface. When the COF structure 12 and the bonding structure 11 are bonded, the third surface is in contact with the first surface A, and the fourth surface is in contact with the second surface B.

It should be noted that, when the bonding structure and the COF structure are clamped with each other, the side of the bonding structure away from the base substrate and the side of the COF structure close to the bonding structure are in contact with each other, and there is almost no gap between the side of the bonding structure away from the base substrate and the side of the COF structure close to the bonding structure. When the bonding structure and the COF structure are clamped with each other, it is possible that protrusions in the bonding structure and depressions in the COF structure are clamped with each other, or depressions in the bonding structure and protrusions in the COF structure are clamped with each other, which is not limited in the embodiments of the present disclosure.

In addition, at least one of the bonding structure and the COF structure is improved in this embodiment of the present disclosure, so that the bonding structure and the COF structure can be clamped. In FIG. 4, this embodiment of the present disclosure is described only with the improvement on a shape of the bonding structure as an example. Of course, only the shape of the COF structure may be improved, or both the shape of the bonding structure and the shape of the COF structure may be improved, which is not limited in the embodiments of the present disclosure.

In summary, since the bonding structure and the COF structure can be clamped with each other in the display apparatus provided by this embodiment of the present disclosure, when the bonding structure is bonded with the COF structure, the position where the bonding area is disposed in the display substrate is uniformly stressed, which reduces the stress at this position, thereby reducing the risk of lead breakage at this position in the display substrate.

Optionally, the display apparatus may be implemented in a plurality of ways. The display apparatus may be explained below by taking one of the implementing ways as an example.

Figure 5:
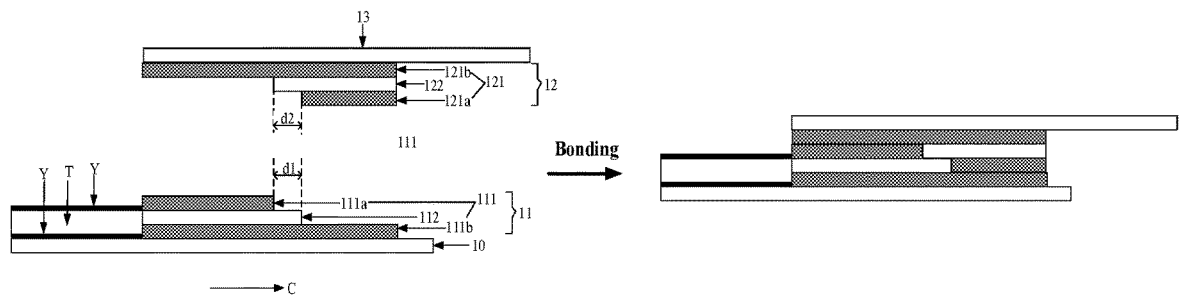
FIG. 5 is a schematic structural diagram of another display apparatus provided by an embodiment of the present disclosure.

FIG. 5 is a schematic structural diagram of another display apparatus provided by an embodiment of the present disclosure. As shown in FIG. 5, the bonding structure 11 in the display apparatus includes a plurality of bonding pattern layers 111 that is sequentially laminated on the base substrate 10, and first insulating layers 112 respectively disposed between each two adjacent bonding pattern layers 111. Each two adjacent bonding pattern layers 111 are insulated by the first insulating layer 112 therebetween. The COF structure 12 includes a plurality of COF layers that is sequentially laminated, and second insulating layers 122 respectively disposed between each two adjacent COF layers 121. Each two adjacent COF layers 121 are insulated by the second insulating layer 122 therebetween.

In FIG. 5, the bonding structure 11 including two bonding pattern layers 111 (111a and 111b, respectively), a first insulating layer 112, two COF layers 121 (121a and 121b, respectively), and a second insulating layer is taken as an example. Of course, the number of bonding pattern layers 111 may also be greater than 2, the number of first insulating layers 112 may also be greater than 1, the number of COF layers 121 may also be greater than 2, and the number of second insulating layers 122 may also be greater than 1, which is not limited in the embodiments of the present disclosure.

The plurality of bonding pattern layers 111 is in one-to-one correspondence with the plurality of COF layers 121, and a side of each bonding pattern layer 111 that is away from the base substrate 10 is bonded with the corresponding COF layer 121. Edges on the side of each of the plurality of bonding pattern layers 111 in the bonding structure 11 that is away from the base substrate 10 are arranged like a stair-step. Since the COF structure 11 and the bonding structure 11 are clamped, edges on the side of each of the plurality of COF layers 121 in the COF structure that is close to the bonding structure 11 are also arranged like a stair-step.

In the case where the bonding structure 11 includes bonding pattern layers 111 and a first insulating layer 112, a first surface A of the bonding structure 11 includes at least a partial area of the surface of each bonding pattern layer 111 away from the base substrate 10; and a second surface B in the bonding structure 11 includes at least one side surface of at least one bonding pattern layer 111. For any bonding pattern layer 111, at least one side surface of the bonding pattern layer 111 includes a side surface of at least one of the front side, the rear side, the left side, and the right side of the bonding pattern layer 111.

In the case where the COF structure 12 includes COF layers 121 and a second insulating layer 122, a third surface of the COF structure 12 includes at least a partial area of the surface of each COF layer 121 close to the bonding structure 11; and a fourth surface in the COF structure 12 includes at least one side surface of at least one COF layer 121. For any COF layer, at least one side surface of the COF layer includes a side surface of at least one of the front side, the rear side, the left side, and the right side of the COF layer.

Taking the structure shown in FIG. 5 as an example, on the one hand, the first surface A of the bonding structure 11 includes: an upper surface of the bonding pattern layer 111a, a partial area of the upper surface of the first insulating layer 112, and a partial area of the upper surface of the bonding pattern layer 111b. Correspondingly, the third surface of the COF structure 12 includes: a lower surface of the COF layer 121a, a partial area of the lower surface of the second insulating layer 122, and a partial area of the lower surface of the COF layer 121b. When the bonding structure is bonded with the COF structure 12, the upper surface of the bonding pattern layer 111a is in contact with the partial area of the lower surface of the CO layer 121b; the partial area of the upper surface of the first insulating layer 112 is in contact with the partial area of the lower surface of the second insulating layer 122; and the partial area of the upper surface of the bonding pattern layer 111b is in contact with the lower surface of the COF layer 121a.

On the other hand, the second surface B of the bonding structure 11 includes: a right side surface of the bonding pattern layer 111a, and a right side surface of the first insulating layer 112. Correspondingly, the fourth surface of the COF structure includes: a left side surface of the COF layer 121a, and a left side surface of the second insulating layer 122. When the bonding structure 11 is bonded with the COF structure 12, the right side surface of the bonding pattern layer 111a is in contact with the left side surface of the second insulating layer 122; and the right side surface of the first insulating layer 112 is in contact with the left side surface of the COF layer 121a.

The bonding structure 11 further includes: a right side surface of the bonding pattern layer 111a, and other side surface of the first insulating layer 112 other than the right side surface. When the second surface B in the bonding structure 11 further includes the other side surface, a contact mode between the other side surface and the COF structure may refer to a contact mode between the right side surface of the bonding pattern layer 111a and the left side surface of the second insulating layer 122 in FIG. 5, which is not repeated in the embodiments of the present disclosure.

It should be noted that each of film layers (e.g., the bonding pattern layer and the COF layer) in the display apparatus may include two opposite surfaces, and a plurality of side surfaces configured to connect the two surfaces, an area of each side surface being smaller than an area of each of the two surfaces.

When the bonding structure includes a plurality of bonding pattern layers, the bonding pattern layers are arranged in a laminated mode. Therefore, a partial area in each of some of these bonding pattern layers that are close to the base substrate can be covered with the bonding pattern layer away from the base substrate. In this way, the bonding pattern layers close to the base substrate are less likely to be broken during the bonding process, thereby increasing a bonding yield.

It should be noted that the step-like arrangement of the edges on the side of each of the plurality of bonding pattern layers 111 that is away from the base substrate 10 may be implemented in a plurality of ways. In the implementation shown in FIG. 5, for the $i^{th}$ bonding pattern layer 111 and the $(i+1)^{th}$ bonding pattern layer 111 which are sequentially arranged in a direction away from the base substrate 10 among these bonding pattern layers 111, the $i^{th}$ bonding pattern layer 111 protrudes beyond the $(i+1)^{th}$ bonding pattern layer 111, where i≥1. Correspondingly, among the plurality of COF layers 121, for the $(i+1)^{th}$ COF layer and the $i^{th}$ COF layer 121 which are sequentially arranged in a first direction, the $(i+1)^{th}$ COF layer 121 protrudes beyond the $i^{th}$ COF layer 121. The first direction is a direction away from the base substrate 10 and can be understood as a direction away from the side of the COF structure 12 that is configured to bonded with the bonding structure 11.

Of course, the step-like arrangement of the edges on the side of each of the plurality of bonding pattern layers 111 that is away from the base substrate 10 may be implemented in a plurality of ways, which is not limited in the embodiments of the present disclosure. For example, the $i^{th}$ bonding pattern layer 111 is flush with the $(i+1)^{th}$ bonding pattern layer 111, and protrudes beyond the $(i+2)^{th}$ bonding pattern layer 111.

A relationship between orthographic projections of each two adjacent bonding pattern layers 111 among the plurality of bonding pattern layers 111 on the base substrate is not limited in the embodiments of the present disclosure. In an example shown in FIG. 5, an orthographic projection of the $(i+1)^{th}$ bonding pattern layer 111 on the base substrate 10 is a first orthographic projection, and an orthographic projection of the $i^{th}$ bonding pattern layer 111 on the base substrate 10 is a second orthographic projection. The first orthographic projection is within the second orthographic projection, and an area of the first orthographic projection is smaller than an area of the second orthographic projection. Correspondingly, an orthographic projection of the $i^{th}$ COF layer 121 on a reference plane is a third orthographic projection, and an orthographic projection of the $(i+1)^{th}$ COF layer 121 on the reference plane is a fourth orthographic projection. The third orthographic projection is within the fourth orthographic projection, and an area of the third orthographic projection is smaller than that of the fourth orthographic projection. The reference plane is parallel to the COF layer 121. For example, the reference plane may be a surface of the base substrate 10 on which the bonding structure 11 is formed.

Optionally, a relationship between the first orthographic projection and the second orthographic projection may not be the relationship shown in FIG. 5; and a relationship between the third orthographic projection and the fourth orthographic projection may not be the relationship shown in FIG. 5.

Figure 6:
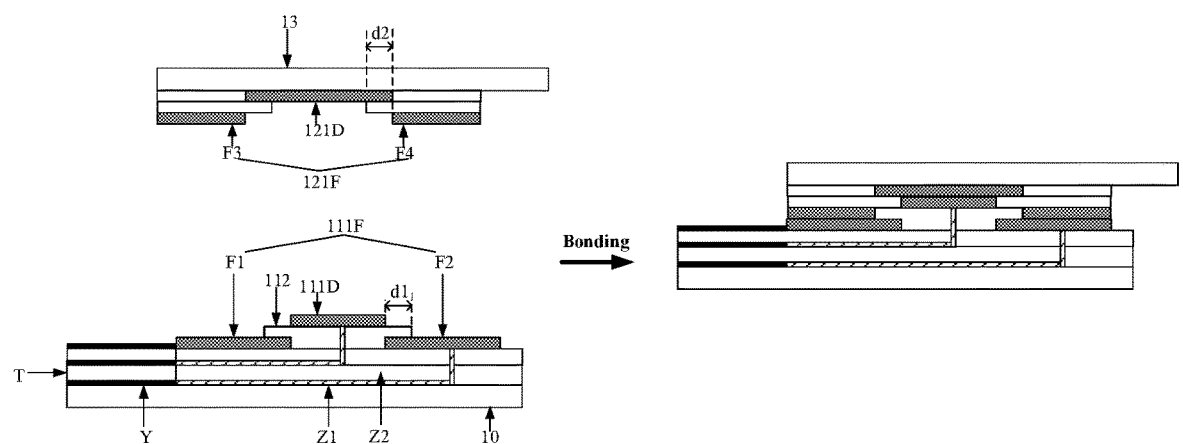
FIG. 6 is a schematic structural diagram of another display apparatus provided by an embodiment of the present disclosure.

For example, as shown in FIG. 6, the plurality of bonding pattern layers includes a first bonding pattern layer 111D and at least one second bonding pattern layer 111F. The at least one second bonding pattern layer 111F is disposed between the base substrate 10 and the first bonding pattern layer 111D. The second bonding pattern layer 111F includes a first sub-pattern F1 and a second sub-pattern F2 spaced from each other, wherein both the first sub-pattern F1 and the second sub-pattern F2 are bonded with a COF layer corresponding to the second bonding pattern layer 111F. A side of the first sub-pattern F1 of the $i^{th}$ bonding pattern layer away from the second sub-pattern F2 of the $i^{th}$ bonding pattern layer protrudes beyond the $(i+1)^{th}$ bonding pattern layer, and a side of the second sub-pattern F2 of the $i^{th}$ bonding pattern layer away from the first sub-pattern F1 of the $i^{th}$ bonding pattern layer protrudes beyond the $(i+1)^{th}$ bonding pattern layer. It can be seen that the first orthographic projection is not within the second orthographic projection, and the area of the first orthographic projection is smaller than an area of the second orthographic projection since a gap is formed between the first sub-pattern F1 and the second sub-pattern F2.

Since the COF structure 12 and the bonding structure 11 are clamped, in an example shown in FIG. 6, the plurality of COF layers includes a first COF layer 121D and a plurality of second COF layers 121F. The plurality of second COF layers is disposed between the first COF layer 121D and the bonding structure. The second COF layer 121F includes a third sub-pattern F3 and a fourth sub-pattern F4 spaced from each other, wherein both the third sub-pattern F3 and the fourth sub-pattern F4 are bonded with a bonding pattern layer corresponding to the second COF layer 121F. With respect to the $i^{th}$ COF layer 121 and the $(i+1)^{th}$ COF layer 121 that are away from the bonding structure, in a direction away from the base substrate 10, the $(i+1)^{th}$ COF layer protrudes beyond a side of the third sub-pattern F3 in the $i^{th}$ COF layer that is close to the fourth sub-pattern F4; and the $(i+1)^{th}$ COF layer 121 further protrudes beyond a side of the fourth sub-pattern F4 in the $i^{th}$ COF layer that is close to the third sub-pattern F3. It can be seen that the third orthographic projection is not within the fourth orthographic projection, and an area of the third orthographic projection is smaller than that of the fourth orthographic projection since a gap is formed between the third sub-pattern F3 and the fourth sub-pattern F4.

In FIG. 6, the display apparatus including a first bonding pattern layer 111D, a first insulating layer 112, a second bonding pattern layer 111F, a first COF layer 121D, a second insulating layer 122 and a second COF layer 121F is taken as an example. Of course, the number of second bonding pattern layers 111F may also be greater than 1, the number of first insulating layers 112 may also be greater than 1, the number of second bonding pattern layers 121F may also be greater than 1, and the number of second insulating layers 112 may also be greater than 1, which is not limited in the embodiments of the present disclosure.

It can be seen from the structure shown in FIG. 6, the first sub-pattern F1 and the second sub-pattern F2 in the first bonding pattern layer are both bonded with the COF structure, which can effectively increase the number of bonding positions in the bonding structure and increase the bonding scale of the bonding structure.

Optionally, regardless of the implementation mode of the bonding structure, if the $i^{th}$ bonding pattern layer 121 protrudes beyond the $(i+1)^{th}$ bonding pattern layer 121, with respect to the first insulating layer 112 between the $i^{th}$ bonding pattern layer 111 and the $(i+1)^{th}$ bonding pattern layer 111: at at least one side of the $i^{th}$ bonding pattern layer 111 (e.g., each side of the $i^{th}$ bonding pattern layer 111), the $i^{th}$ bonding pattern layer 111 protrudes beyond the first insulating layer 112, and the first insulating layer 112 protrudes beyond the $(i+1)^{th}$ bonding pattern layer 111. In the case, the first surface A of the bonding structure 11 further includes at least a partial area of the surface of the bonding pattern layer 112 away from the base substrate 10; and the second surface B in the bonding structure 11 further includes at least one side surface of the first insulating layer 112.

Since the COF structure 12 and the bonding structure are clamped, with respect to the second insulating layer 112 between the $i^{th}$ COF layer 121 and the $(i+1)^{th}$ COF layer 121 in a direction away from the base substrate: at at least one side of the $i^{th}$ COF layer 121, the $(i+1)^{th}$ COF layer 121 protrudes beyond the second insulating layer 112, and the second insulating layer 112 protrudes beyond the $i^{th}$ COF layer 121. At least one side of the $i^{th}$ COF layer 121 may be at least one of the front side, the rear side, the left side, and the right side of the $i^{th}$ COF layer 121.

Of course, at the at least one side of the $i^{th}$ bonding pattern layer 111, the first insulating layer 11 may also be flush with the $i^{th}$ bonding pattern layer 111 (or the $(i+1)^{th}$ bonding pattern layer); and correspondingly, at the at least one side of the $i^{th}$ COF layer 121, the second insulating layer 122 may also be flush with the $(i+1)^{th}$ COF layer 121 (or the $i^{th}$ COF layer), which is not limited in the embodiments of the present disclosure.

Optionally, with respect to the first insulating layer 112 between the $i^{th}$ bonding pattern layer 111 and the $(i+1)^{th}$ bonding pattern layer 111: at the at least one side of the $i^{th}$ bonding pattern layer 111, when the first insulating layer 112 protrudes beyond the $(i+1)^{th}$ bonding pattern layer 111, the first insulating layer 112 protrudes beyond the $(i+1)^{th}$ bonding pattern layer 111 for a length d1 (shown in FIG. 5 or FIG. 6) smaller than or equal to 60 microns, at each of the at least one side. Optionally, the length d1 may be larger than or equal to 20 microns and is smaller than or equal to 40 microns.

Since the COF structure 12 and the bonding structure 11 are clamped, with respect to the second insulating layer 112 between the $i^{th}$ COF layer 121 and the $(i+1)^{th}$ COF layer 121 in a direction away from the base substrate 10: at the at least one side of the $i^{th}$ COF layer 121, when the second insulating layer 122 protrudes beyond the $i^{th}$ COF layer 121, the second insulating layer 122 protrudes beyond the $i^{th}$ COF layer 112 for a length d2 (shown in FIG. 5 or FIG. 6) smaller than or equal to 60 microns, at each of the at least one side. Optionally, this length may be larger than or equal to 20 microns and smaller than or equal to 40 microns.

It can be seen that the length d1 for which the first insulating layer 112 protrudes beyond the $(i+1)^{th}$ bonding pattern layer 111 is relatively small. Therefore, the length d1 for which the $i^{th}$ bonding pattern layer 111 protrudes beyond the $(i+1)^{th}$ bonding pattern layer 111 is relatively small either. Therefore, the edges of the adjacent bonding pattern layers 111 are relatively close, and the entire bonding structure 11 occupies a small area on the base substrate, such that a border of the entire display apparatus is relatively narrow.

When the bonding structure 11 includes a plurality of bonding pattern layers 111, regardless of the implementation mode of the bonding structure 11, each bonding pattern layer 111 includes at least one first pin; and the COF layer 121 includes at least one second pin. In addition, the first pins of the bonding pattern layer 111 are in one-to-one correspondence with the second pins of the corresponding COF layer 121. The side of each first pin away from the base substrate 10 is bonded with the corresponding second pin.

Figure 7:
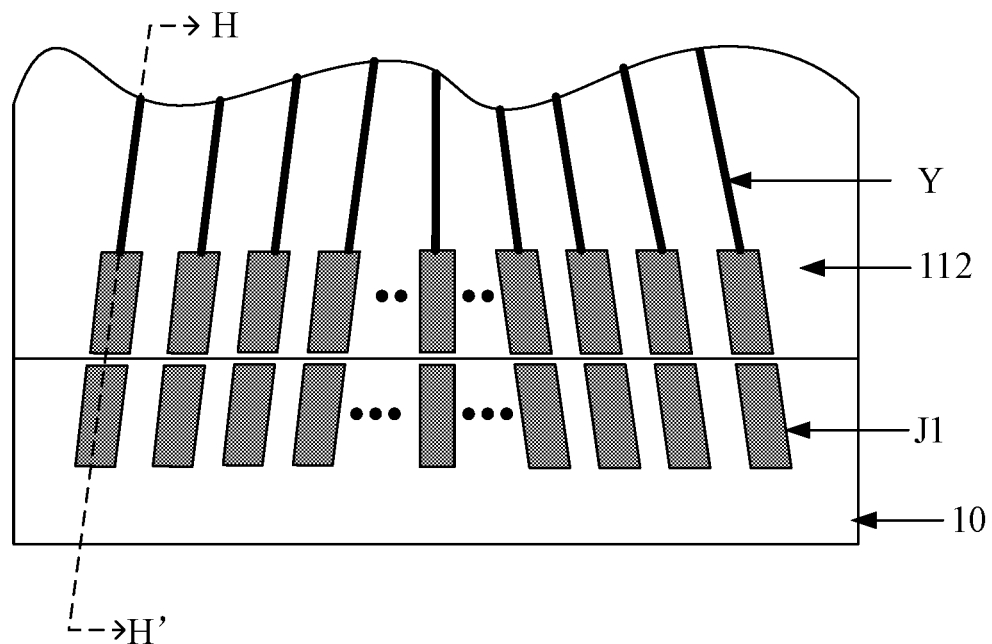
FIG. 7 is a top view of a structure other than COF structures in FIG. 5 provided by an embodiment of the present disclosure.

In an exemplary embodiment, FIG. 7 is a top view of a structure in FIG. 5 except for COF provided by an embodiment of the present disclosure. FIG. 5 shows a structure of a section HH' in FIG. 7. In conjunction with FIG. 5 and FIG. 7, each bonding pattern layer 111 includes a plurality of first pins J1. In addition, since the first bonding pattern layer 111 in the two bonding pattern layers 111 that is close to the base substrate 10 protrudes beyond the second bonding pattern layer 111, the first pin J1 in the first bonding pattern layer 111 protrudes beyond the first pin J1 in the second bonding pattern layer 111. When the COF structure is bonded with the bonding structure, these first pins J1 may all be bonded to the corresponding second pins in the COF structure. Correspondingly, each COF layer includes a plurality of second pins. In addition, since the second COF layer in the two COF layers that is away from the base substrate protrudes beyond the first COF layer, the second pin J1 in the second COF layer protrudes beyond the second pin in the first COF layer.

Figure 8:
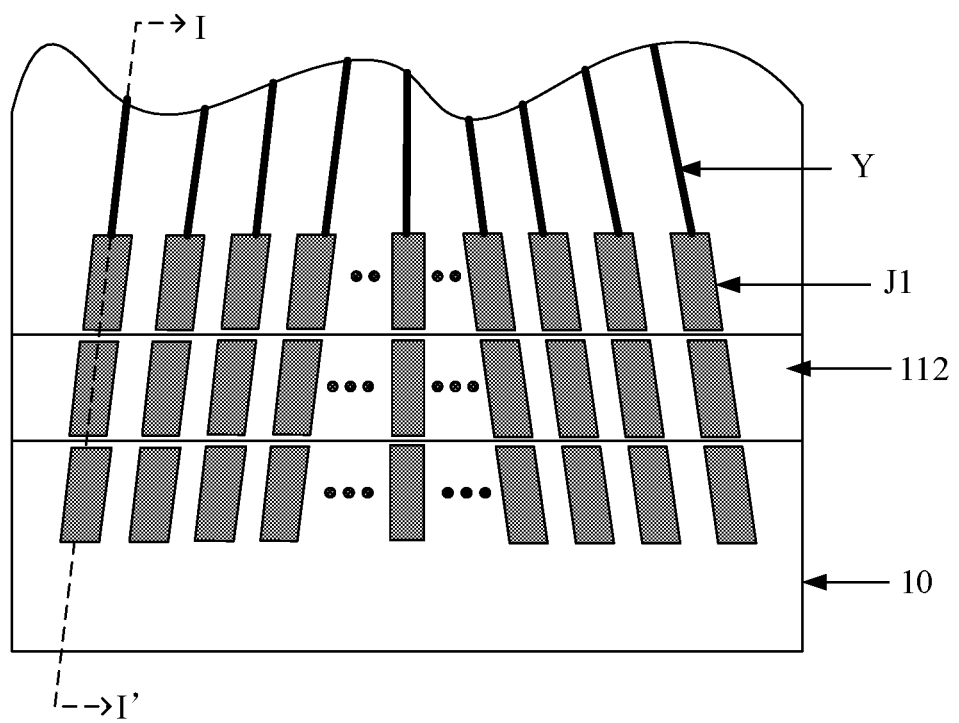
FIG. 8 is a top view of a structure other than COF structures in FIG. 6 provided by an embodiment of the present disclosure.

In another exemplary embodiment, FIG. 8 is a top view of a structure in FIG. 6 except for COF provided by an embodiment of the present disclosure. FIG. 6 shows a structure of a section II' in FIG. 8. In conjunction with FIG. 6 and FIG. 8, the first bonding pattern layer HID includes a plurality of first pins J1; and the first sub-pattern F1 and the second sub-pattern F2 in the second bonding pattern layer 111F each include a plurality of first pins J1. In addition, since both the first sub-pattern F1 and the second sub-pattern F2 protrude beyond the first bonding pattern layer 111D, the first pins J1 in the first sub-pattern F1 and the second sub-pattern F2 protrude beyond the first pins J1 in the first bonding pattern layer 111D, such that these first pins J2 may all be bonded to the corresponding second pins in the COF structure when the COF structure and the bonding structure are bonded. Correspondingly, the first COF layer includes a plurality of second pins; and the third sub-pattern and the fourth sub-pattern in the second bonding pattern layer each include a plurality of second pins. In addition, since the first COF layer protrudes beyond the third sub-pattern and the fourth sub-pattern, the second pins in the first COF layer protrude beyond the second pins in the third sub-pattern and the fourth sub-pattern.

It should be noted that, when the first pins in the bonding structure 11 are arranged in an arrangement mode shown in FIG. 2, a width between the two rows of first pins is relatively large in a direction from the display area to the bonding area, resulting in a larger width of the bonding area, and a wider border of the entire display apparatus. However, in the display apparatus provided by this embodiment of the present disclosure, the display apparatus provided by this embodiment of the present disclosure can achieve a narrow border effect when the first pins are not arranged on the basis of the mode shown in FIG. 2.

Optionally, the display apparatus further includes a plurality of pins on the base substrate. For example, these leads may include at least one of leads such as data lines and gate lines. The first pins in the bonding structure are in one-to-one correspondence with the plurality of leads, and the first pins in each bonding pattern layer are connected to the leads corresponding to these first pins.

The first pins and the corresponding leads in the display apparatus may be disposed in the same layer or in different layers, which is not limited in the embodiments of the present disclosure. In an exemplary embodiment, in conjunction with FIG. 5 and FIG. 7, each first pin J1 and a corresponding lead Y may be disposed in the same layer. In another exemplary embodiment, in conjunction with FIG. 6 and FIG. 8, the first pins J1 in the first sub-pattern F1 and the corresponding leads Y are disposed in the same layer; and the first pins J1 in the second sub-pattern F2 and the first pins J1 in the first bonding pattern layer 111D are both disposed in different layers from the corresponding leads Y.

On the one hand, for the first pin J1 and the corresponding lead Y disposed in the same layer, the first pin J1 and the corresponding lead Y may be directly connected. The first pin J1 in FIG. 5 and FIG. 7 is directly connected to the corresponding lead Y. The first pin J1 in the first sub-pattern F1 in FIG. 6 and FIG. 8 is directly connected to the corresponding lead Y. Alternatively, for the first pin J1 and the corresponding lead Y in different layers, the first pin J1 and the corresponding lead Y may be connected via a connecting structure.

On the one hand, for the first pins J1 and the corresponding leads Y in different layers, the first pins J1 and the corresponding leads Y may be connected through a connecting structure. The first pin J1 in the second sub-pattern F2 in FIG. 6 and FIG. 8 is connected to the corresponding lead Y via a connecting structure. The first pin J1 in the first bonding pattern layer 111D is also connected to the corresponding lead Y via a connecting structure.

It is clear that at least part of the first pin in the display apparatus is connected to the corresponding lead through the connecting structure.

In an exemplary embodiment, the connecting structure may include: at least one connecting unit laminated between the base substrate and the bonding structure. Each connecting unit includes a connecting pattern layer and a connection insulating layer which are sequentially laminated in a direction away from the base substrate. Each connecting unit is in one-to-one correspondence with at least one first pin. With respect to the first pin and the lead that need to be connected through the connecting structure, the first pin is connected to this lead through the connecting pattern layer in the corresponding connecting unit. As shown in FIG. 6 and FIG. 8, the connecting structure includes two connecting units (including two connecting pattern layers Z1 and two connection insulating layers Z2). The first pin J1 in the second sub-pattern F2 is connected to the corresponding lead Y through the first connecting pattern layer Z1 close to the base substrate 10. The first pin J1 in the first bonding pattern layer 111D is also connected to the corresponding lead Y through the second connecting pattern layer Z1 close to the base substrate 10.

Since the connecting structure in this embodiment of the present disclosure is disposed between the base substrate and the bonding structure, the connecting structure can be hidden under the bonding structure. Therefore, the stability of the connecting structure is relatively high, such that the probability in breakage of the connecting pattern layer in the connecting structure is relatively low.

Optionally, the plurality of leads in the display apparatus may be disposed on the same layer, or on different layers. In FIG. 5 and FIG. 6, a plurality of leads being disposed in different layers is taken as an example. When the plurality of leads is disposed in different layers, the leads disposed in different layers may be insulated by a lead insulating layer T.

Further, continuously referring to FIG. 5 and FIG. 6, the display apparatus provided by this embodiment of the present disclosure further includes an FPC 13. The COF structure 12 is bonded with the FPC 13. A side of the COF structure 12 away from the FPC 13 is bonded with the bonding structure 11.

Optionally, the display apparatus in this embodiment of the present disclosure may be a flexible display apparatus (which is foldable and bendable). A material of the base substrate includes a flexible material. A material of insulating layers (such as the first insulating layer, the second insulating layer, the lead insulating layer, the connection insulating layer, or the like) in this embodiment of the present disclosure may include: SiNx (silicon nitride), PI (polyimide) or other insulating material.

The display apparatus provided by this embodiment of the present disclosure may be any product or component having a display function, such as an OLED display apparatus, a liquid crystal display apparatus, a miniature LED display apparatus, a display panel, electronic paper, a mobile phone, a tablet computer, a television, a notebook computer, a digital photo frame, a navigator or the like.

In summary, since the bonding structure and the COF structure can be clamped with each other in the display apparatus provided by this embodiment of the present disclosure, when the bonding structure is bonded with the COF structure, a position where the bonding area is disposed in the display substrate is uniformly stressed, which reduces the stress at this position, thereby reducing the risk of lead breakage at this position in the display substrate.

In addition, in the display apparatus shown in FIG. 5 and FIG. 6, an arrangement width between the first pins in each bonding pattern layer in the bonding structure is relatively small, and a width of the entire bonding structure is relatively small in the arrangement width.

An embodiment of the present disclosure provides a display substrate. The display substrate may be a display substrate in any of the display apparatuses provided by embodiments of the present disclosure. For example, the display substrate may be the display substrate in the display apparatus shown in any one of FIG. 4, FIG. 5, FIG. 6, FIG. 7 and FIG. 8.

In an exemplary embodiment, as shown in FIG. 4, the display substrate may include a base substrate 10 and a bonding structure 11. The bonding structure 11 is disposed on the base substrate 10. A side of the bonding structure 11 away from the base substrate 10 is configured to be bonded with the COF structure, and the side of the bonding structure 11 away from the base substrate 10 and the COF structure can also be clamped with each other. The bonding structure 11 includes a first surface A and a second surface B that are away from the base substrate 10. An included angle is formed between the first surface A and the second surface B. In addition, when the bonding structure and the COF structure are bonded, the first surface A and the second surface B are both configured to be in contact with the COF structure.

Optionally, the bonding structure includes a plurality of bonding pattern layers that is sequentially laminated on the base substrate, and first insulating layers respectively disposed between each two adjacent bonding pattern layers.

The COF structure includes a plurality of COF layers that is sequentially laminated on the FPC, and second insulating layers respectively disposed between each two adjacent COF layers.

The plurality of bonding pattern layers is in one-to-one correspondence with the plurality of COF layers, and a side of each bonding pattern layer that is away from the base substrate is configured to be bonded with the corresponding COF layer.

Edges on the side of each of the plurality of bonding pattern layers that is away from the base substrate are arranged like a stair-step. The first surface includes at least a part of an area of a surface of the bonding pattern layer that is away from the base substrate; and the second surface includes at least one side surface of at least one bonding pattern layer.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

Optionally, a first orthographic projection is within a second orthographic projection, and an area of the first orthographic projection is smaller than an area of the second orthographic projection.

The first orthographic projection is an orthographic projection of the $(i+1)^{th}$ bonding pattern layer on the base substrate, and the second orthographic projection is an orthographic projection of the $i^{th}$ bonding pattern layer on the base substrate.

Optionally, the plurality of bonding pattern layers includes a first bonding pattern layer and at least one second bonding pattern layer.

The at least one second bonding pattern layer is disposed between the base substrate and the first bonding pattern layer. The second bonding pattern layer includes a first sub-pattern and a second sub-pattern spaced from each other, wherein both the first sub-pattern and the second sub-pattern are bonded with a COF layer corresponding to the second bonding pattern layer.

A side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first sub-pattern of the $i^{th}$ bonding pattern layer protrudes beyond the $(i+1)^{th}$ bonding pattern layer.

Optionally, for a first insulating layer between the $i^{th}$ bonding pattern layer and the $(i+1)^{th}$ bonding pattern layer,
at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

Optionally, for a first insulating layer between the it bonding pattern layer and the $(i+1)^{th}$ bonding pattern layer:
at each of the at least one side of the $i^{th}$ bonding pattern layer, the first insulating layer protrudes beyond the $(i+1)^{th}$ bonding pattern layer for a length of smaller than or equal to 60 microns. Optionally, this length is larger than or equal to 20 microns and is smaller than or equal to 40 microns.

Optionally, the bonding pattern layer includes at least one first pin. The COF layer includes at least one second pin.

The first pins in the bonding pattern layer are in one-to-one correspondence with the second pins in the corresponding COF layer. Each first pin is configured to be bonded with the corresponding second pin.

The display substrate further includes a plurality of leads disposed on the base substrate. The first pins in the bonding structure are in one-to-one correspondence with the plurality of leads, and are connected to the corresponding leads.

Optionally, the display substrate further includes a connecting structure disposed on the base substrate, wherein at least part of the first pin is connected to the corresponding lead through a connecting structure.

Optionally, a material of the base substrate includes a flexible material.

Details of the structure of the display substrate provided by this embodiment of the present disclosure may refer to the structure of the display substrate in the embodiment of the above-mentioned display apparatus, which is not repeated in the embodiments of the present disclosure.

An embodiment of the present disclosure provides a COF structure. The COF structure may be a COF structure in any of display apparatuses according to the embodiments of the present disclosure. For example, the COF structure may be the COF structure in the display apparatus shown in any one of FIG. 4, FIG. 5, FIG. 6, FIG. 7 and FIG. 8.

In an exemplary embodiment, the COF structure is configured to be bonded with a side of the bonding structure away from the base substrate, and the COF structure and the side of the bonding structure away from the base substrate can be clamped with each other. The COF structure includes a third surface and a fourth surface. The third surface is at an angle with the fourth surface. In addition, when the bonding structure and the COF structure are bonded, the third surface A and the fourth surface B are both configured to be in contact with the bonding structure.

Optionally, the bonding structure includes a plurality of bonding pattern layers that is sequentially laminated on the base substrate, and first insulating layers respectively disposed between each two adjacent bonding pattern layers.

The COF structure includes a plurality of COF layers that is sequentially laminated, and second insulating layers respectively disposed between each two adjacent COF layers.

The plurality of bonding pattern layers is in one-to-one correspondence with the plurality of COF layers. Each COF layer is configured to be bonded to a side of the corresponding bonding pattern layer that is away from the base substrate.

Edges on the side of each of the plurality of bonding pattern layers that is configured to be bonded with the bonding structure are arranged like a stair-step. The third surface includes at least a partial area of a side of the COF layer to be bonded with the bonding structure; and the fourth surface includes at least one side surface of at least one COF layer.

Optionally, among the plurality of COF layers, for an $i^{th}$ COF layer and an $(i+1)^{th}$ COF layer arranged along a first direction, the $i^{th}$ COF layer protrudes beyond the $(i+1)^{th}$ COF layer, where $i \geq 1$, wherein the first direction is a direction away from a side of the COF structure for bonding with the bonding structure.

Optionally, a third orthographic projection is within a fourth orthographic projection, and an area of the third orthographic projection is smaller than that of the fourth orthographic projection.

The third orthographic projection is an orthographic projection of the $i^{th}$ bonding pattern layer on a reference plane, and the fourth orthographic projection is an orthographic projection of the $(i+1)^{th}$ bonding pattern layer on the reference plane, the reference plane being parallel to the COF layers.

Optionally, the plurality of COF layers includes a first COF layer and at least one second COF layer.

The at least one second COF layer is disposed on a side of the first COF layer that is configured to be bonded with the bonding structure. The second COF layer includes a third sub-pattern and a fourth sub-pattern spaced from each other, wherein both the third sub-pattern and the fourth sub-pattern are bonded with a bonding pattern layer corresponding to the second COF layer.

The $(i+1)^{th}$ COF layer protrudes beyond a side of the third sub-pattern in the $i^{th}$ COF layer that is close to the fourth sub-pattern; and the $(i+1)^{th}$ COF layer protrudes beyond a side of the fourth sub-pattern in the $i^{th}$ COF layer that is away from the third sub-pattern.

Optionally, for a second insulating layer between the $i^{th}$ COF layer and the $(i+1)^{th}$ COF layer:
at at least one side of the $i^{th}$ bonding pattern layer, the $(i+1)^{th}$ bonding pattern layer protrudes beyond the second insulating layer, and the second insulating layer protrudes beyond the $i^{th}$ bonding pattern layer.

Optionally, for a second insulating layer between the $i^{th}$ COF layer and the $(i+1)^{th}$ COF layer:
at each of the at least one side, the second insulating layer protrudes beyond the $i^{th}$ COF layer for a length of smaller than or equal to 60 microns. Optionally, this length is larger than or equal to 20 microns and is smaller than or equal to 40 microns.

Optionally, the bonding pattern layer includes at least one first pin. The COF layer includes at least one second pin. The first pins in the bonding pattern layer are in one-to-one correspondence with the second pins in the corresponding COF layer. Each second pin is configured to be bonded with a side of the corresponding first pin away from the base substrate.

Optionally, the COF structure is further configured to be bonded with an FPC, wherein a side of the COF structure away from the FPC is bonded with the bonding structure.

Details of the structure of the COF structure provided by the embodiment of the present disclosure may refer to the structure of the COF structure in the embodiment of the above-mentioned display apparatus, which is not repeated in the embodiments of the present disclosure.

An embodiment of the present disclosure provides a method for manufacturing a display apparatus. This method may be used to manufacture any display apparatus (e.g., the display apparatus shown in any one of FIGS. 4 to 8) provided by the embodiments of the present disclosure.

Figure 9:
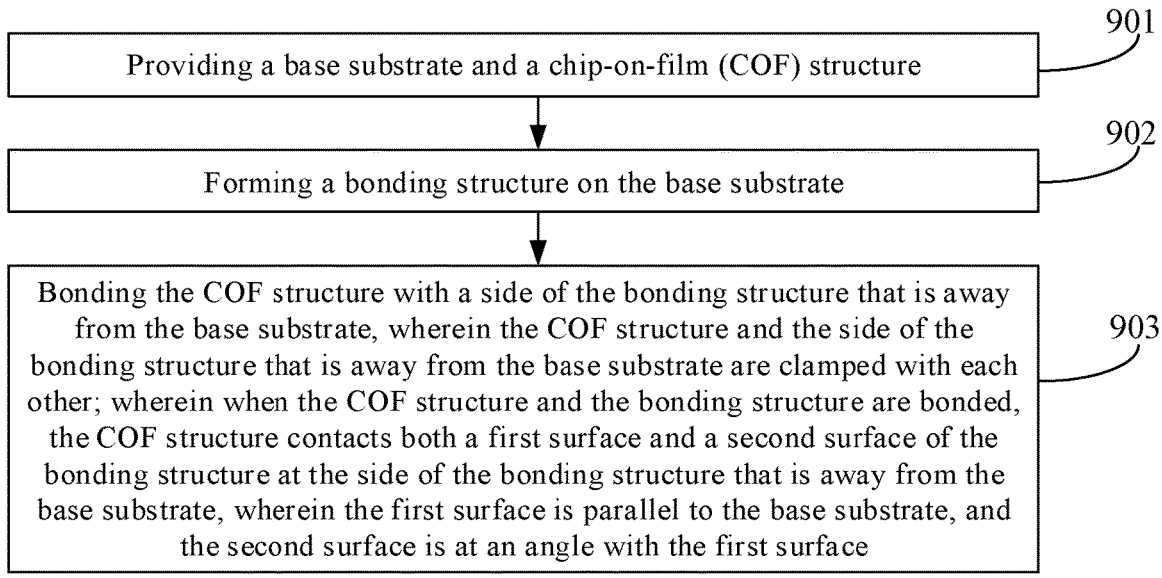
FIG. 9 is a flowchart of a method for manufacturing a display apparatus provided by an embodiment of the present disclosure.

In an exemplary embodiment, FIG. 9 is a flowchart of a method for manufacturing a display apparatus according to an embodiment of the present disclosure. As shown in FIG. 9, this method may include the following steps.

In 901, a base substrate and a COF structure are provided.

In 902, a bonding structure is formed on the base substrate.

In 903, the COF structure is bonded with a side of the bonding structure that is away from the base substrate, wherein the COF structure and the side of the bonding structure that is away from the base substrate are clamped with each other. When the COF structure and the bonding structure are bonded, the COF structure contacts both a first surface and a second surface of the bonding structure at the side of the bonding structure that is away from the base substrate, wherein the first surface is parallel to the base substrate, and the second surface is at an angle with the first surface.

In summary, since the bonding structure and the COF structure can be clamped with each other in the display apparatus manufactured by the method provided by this embodiment of the present disclosure, when the bonding structure and the COF structure are bonded, a position where the bonding area is disposed in the display substrate is uniformly stressed, which reduces the stress at this position, thereby reducing the risk of lead breakage at this position in the display substrate.

Figure 10:
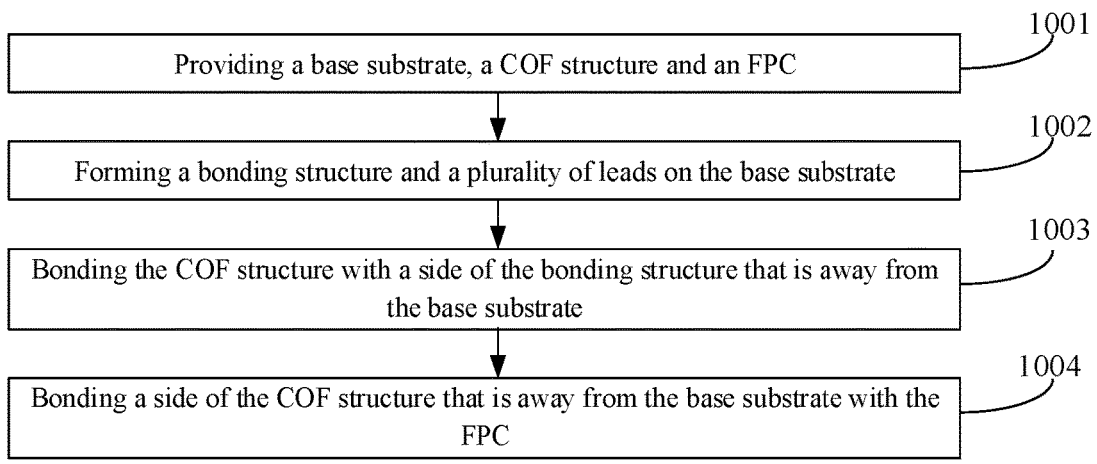
FIG. 10 is a flowchart of another method for manufacturing a display apparatus according to an embodiment of the present disclosure.

In another exemplary embodiment, FIG. 10 is a flowchart of a method for manufacturing another display apparatus according to an embodiment of the present disclosure. In FIG. 10, manufacturing the display apparatus shown in FIG. 5 and FIG. 7 is taken as an example. As shown in FIG. 10, the method may include the following steps.

In 1001, a base substrate, a COF structure and an FPC are provided.

Optionally, a material of the base substrate includes a flexible material or a rigid material.

The COF structure includes a plurality of COF layers that is sequentially laminated, and second insulating layers respectively disposed between each two adjacent COF layers. The plurality of bonding pattern layers is in one-to-one correspondence with the plurality of COF layers. Edges on the side of each of the plurality of bonding pattern layers that is away from the base substrate are arranged like a stair-step.

The COF structure may be prepared before step 1001, or may be manufactured in step 1001, which is not limited in the embodiments of the present disclosure. In the process of manufacturing the COF structure, respective film layers in the COF structure, such as the COF layers and the second insulating layers, may be sequentially formed according to the structure of the COF structure.

When each film layer in the COF structure is formed, a material layer of the film layer may be formed first, and the material layer is then processed by a primary patterning process to acquire the film layer.

The primary patterning process includes: photoresist coating, exposure, development, etching and photoresist stripping. Processing the material layer by using the primary patterning process includes: coating the material layer with a layer of photoresist; then exposing the photoresist by using a mask plate, such that the photoresist forms an exposed area and a non-exposed area; next, processing with a developing process to remove the photoresist from one of the exposed area and the non-exposed area, and reserving the photoresist of the other area; etching an area, which is not covered with the photoresist, on the material layer; and stripping the photoresist on the material layer after the completion of the etching, thereby acquiring the film layer. It should be noted that the photoresist may be a positive photoresist or a negative photoresist. If the photoresist is a positive photoresist, after the above-mentioned developing process, the photoresist in the exposed area is removed, while the photoresist in the non-exposed area remains. If the photoresist is a positive photoresist, after the above-mentioned developing process, the photoresist in the exposed area is removed, and the photoresist in the non-exposed area remains.

In 1002, a bonding structure and a plurality of leads are formed on the base substrate.

The bonding structure includes a plurality of bonding pattern layers that is sequentially laminated on the base substrate, and first insulating layers respectively disposed between each two adjacent bonding pattern layers. The edges on a side of each of the plurality of bonding pattern layers that is away from the base substrate are arranged like a stair-step. When the bonding structure is formed on the base substrate, a plurality of bonding pattern layers and first insulating layers respectively disposed between each two adjacent bonding pattern layers may be sequentially laminated on the base substrate to acquire the bonding structure. The COF structure and a side of the bonding structure that is away from the base substrate can be clamped with each other.

The process of forming each film layer in the bonding structure may refer to the above-mentioned process of forming each film layer in the COF structure, which is not repeated in the embodiments of the present disclosure.

Optionally, for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$. In this embodiment of the present disclosure, the patterning process used to form the bonding pattern layer can be adaptively adjusted according to a shape and structure of the bonding pattern layer to be formed, so that the $i^{th}$ bonding pattern layer protrudes beyond the $(i+1)^{th}$ bonding pattern layer.

Optionally, with respect to the first insulating layer between the $i^{th}$ bonding pattern layer and the $(i+1)^{th}$ bonding pattern layer, at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer. The process of forming the first insulating layer may refer to the above-mentioned process of forming the bonding pattern layer, which is not repeated in the embodiments of the present disclosure.

Optionally, with respect to the first insulating layer between the $i^{th}$ bonding pattern layer and the $(i+1)^{th}$ bonding pattern layer: at each of the at least one side of the $i^{th}$ bonding pattern layer, the first insulating layer protrudes beyond the $(i+1)^{th}$ bonding pattern layer for a length of smaller than or equal to 60 microns. For example, this length is larger than or equal to 20 microns and is smaller than or equal to 40 microns.

Optionally, this embodiment of the present disclosure is configured to manufacture the display apparatus shown in FIG. 5 and FIG. 7. Therefore, a first orthographic projection is within a second orthographic projection, and an area of the first orthographic projection is smaller than an area of the second orthographic projection. The first orthographic projection is an orthographic projection of the $(i+1)^{th}$ bonding pattern layer on the base substrate, and the second orthographic projection is an orthographic projection of the $i^{th}$ bonding pattern layer on the base substrate.

When this embodiment of the present disclosure is configured to manufacture the display apparatus shown in FIG. 6 and FIG. 8, a plurality of bonding pattern layers includes a first bonding pattern layer and at least one second bonding pattern layer. The at least one second bonding pattern layer is disposed between the base substrate and the first bonding pattern layer. The second bonding pattern layer includes a first sub-pattern and a second sub-pattern spaced from each other. A side of the first sub-pattern in the $i^{th}$ bonding pattern layer that is away from the second sub-pattern protrudes beyond the $(i+1)^{th}$ bonding pattern layer. A side of the second sub-pattern in the $i^{th}$ bonding pattern layer that is away from the first sub-pattern protrudes beyond the $(i+1)^{th}$ bonding pattern layer.

Each bonding pattern layer includes at least one first pin. The first pins in the bonding structure is in one-to-one correspondence with the plurality of leads, and the first pin is connected to a corresponding lead.

Figure 11:
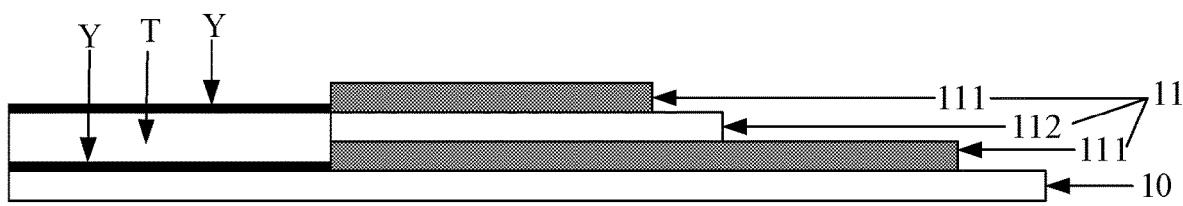
FIG. 11 is a schematic diagram of a partial structure of a display apparatus provided by an embodiment of the present disclosure.

After the bonding structure and the plurality of leads in the display apparatus in FIG. 5 and FIG. 7 are formed on the base substrate, the structure shown in FIG. 11 can be acquired.

The plurality of leads in the display apparatus may be disposed in the same layer or in different layers. When the plurality of leads is disposed in different layers, in 1002, a lead insulating layer T may also be formed between the leads of different layers.

The display apparatus shown in FIG. 5 and FIG. 7 is described by taking each pin being directly connected to a corresponding lead as an example. When at least part of the first pin is connected to the lead corresponding to the first pin through a connecting structure, the connecting structure needs to be formed in 1002, so that the at least part of the first pin is connected to the corresponding lead through the connecting structure.

In 1003, the COF structure is bonded with a side of the bonding structure that is away from the base substrate.

When the COF structure is bonded with a side of the bonding structure that is away from the base substrate, the side of each bonding pattern layer that is away from the base substrate may be bonded to the corresponding COF layer.

Optionally, the bonding pattern layer includes at least one first pin. The COF layer includes at least one second pin. The first pins in the bonding pattern layer are in one-to-one correspondence with the second pins in the COF layer. When a side of each bonding pattern layer that is away from the base substrate is bonded with the corresponding COF layer, a side of each first pin that is away from the base substrate may be bonded with the corresponding second pin.

In 1004, a side of the COF structure that is away from the base substrate is bonded with an FPC.

A side of the COF structure away from the FPC is bonded with the bonding structure.

Optionally, the COF structure may also be bonded with the FPC first, and a side of the COF structure that is away from the FPC is then bonded with the bonding structure, which is not limited in the embodiments of the present disclosure.

After both the FPC and the bonding structure are bonded with the COF structure, the display apparatus shown in FIG. 5 and FIG. 7 may be acquired.

In summary, since the bonding structure and the COF structure can be clamped with each other in the display apparatus manufactured by the method provided by this embodiment of the present disclosure, when the bonding structure and the COF structure are bonded, the position where the bonding area is disposed in the display substrate is uniformly stressed, which reduces the stress at this position, thereby reducing the risk of lead breakage at this position in the display substrate.

It should be noted that the above-mentioned layer forming operations include, but are not limited to (chemical phase, physical phase) film formation under deposition, and film formation under (magnetron) sputtering, which is not be repeated in the present disclosure.

Figure 12:
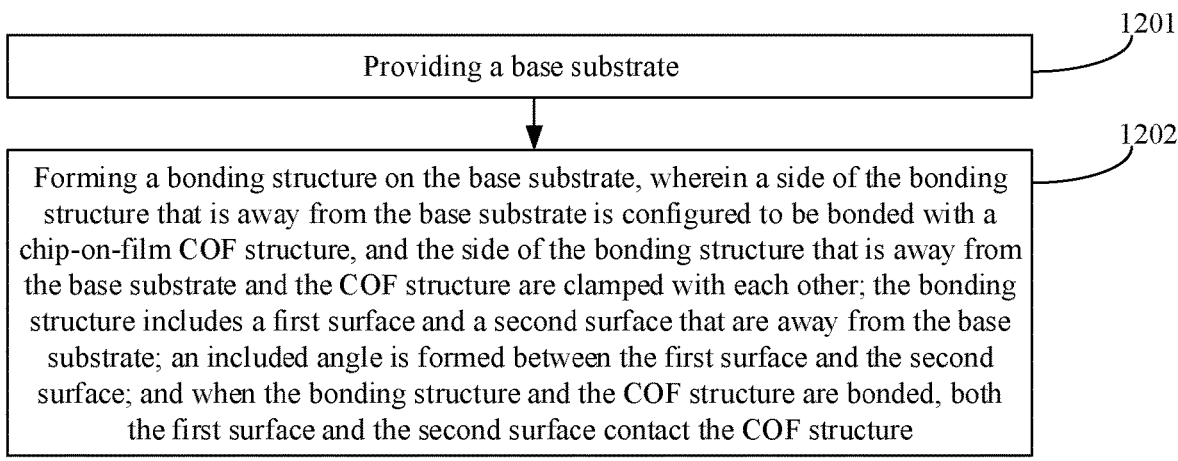
FIG. 12 is a flowchart of a method for manufacturing a display substrate provided by an embodiment of the present disclosure.

FIG. 12 is a flowchart of a method for manufacturing a display substrate provided by an embodiment of the present disclosure. The method is configured to manufacture any of the display substrates provided by the embodiments of the present disclosure. Referring to FIG. 12, the method includes the following steps.

In 1201, a base substrate is provided.

In 1202, a bonding structure is formed on the base substrate. A side of the bonding structure away from the base substrate is configured to be bonded to the COF structure, and the COF structure and the side of the bonding structure away from the base substrate are clamped with each other. The bonding structure includes a first surface and a second surface that are away from the base substrate. An included angle is formed between the first surface and the second surface. In addition, when the bonding structure and the COF structure are bonded, the first surface and the second surface are both configured to be in contact with the COF structure.

When the bonding structure is formed, a plurality of bonding pattern layers and first insulating layers respectively disposed between each two adjacent bonding pattern layers are sequentially laminated on the base substrate.

In summary, since the COF structure and the bonding structure in the display substrate manufactured by the method provided by this embodiment of the present disclosure can be clamped with each other, when the bonding structure and the COF structure are bonded, the position where the bonding area is disposed in the display substrate is uniformly stressed, which reduces the stress at this position, thereby reducing the risk of lead breakage at this position in the display substrate.

Figure 13:
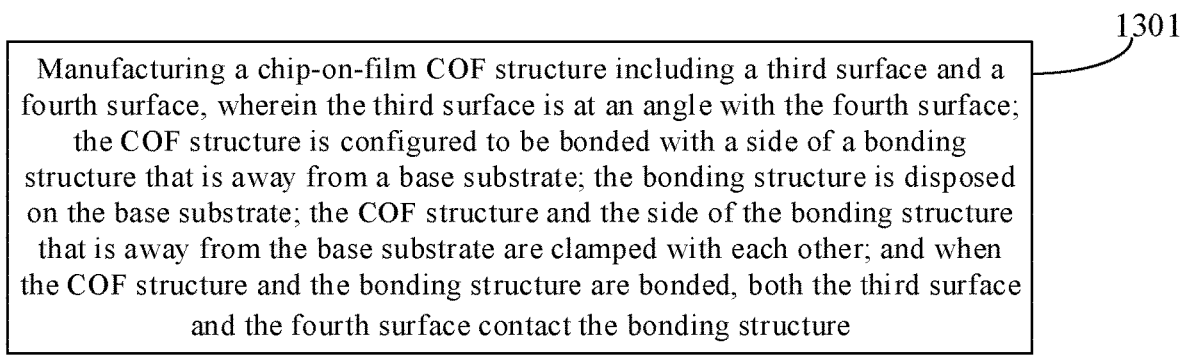
FIG. 13 is a flowchart of a method for manufacturing a COF structure provided by an embodiment of the present disclosure.

FIG. 13 is a flowchart of a method for manufacturing a COF structure provided by an embodiment of the present disclosure. The method is configured to manufacture any of COFs provided by the embodiments of the present disclosure. Referring to FIG. 13, the method may include the following steps.

In 1301, a COF structure including a third surface and a fourth surface is manufactured, wherein the third surface is at an angle with the fourth surface. The COF structure is configured to be bonded with a side of the bonding structure that is away from a base substrate. The bonding structure is disposed on the base substrate. The COF structure and the side of the bonding structure that is away from the base substrate are clamped with each other. When the COF structure and the bonding structure are bonded, both the third surface and the fourth surface are configured to be in contact with the bonding structure.

In the process of manufacturing the COF structure, respective film layers in the COF structure, such as the COF layers and the second insulating layers, may be sequentially formed according to the structure of the COF structure. When each film layer in the COF structure is formed, a material layer of the film layer may be formed first, and the material layer is then processed by a primary patterning process to acquire the film layer.

In summary, since the bonding structure and the COF structure manufactured by the method provided by this embodiment of the present disclosure can be clamped with each other, when the bonding structure and the COF structure are bonded, the position where the bonding area is disposed in the display substrate is uniformly stressed, which reduces the stress at this position, thereby reducing the risk of lead breakage at this position in the display substrate.

The method for manufacturing the display substrate provided by this embodiment of the present disclosure may refer to the steps of manufacturing the display substrate in the method for manufacturing any of display apparatuses provided by the embodiments of the present disclosure; and the method for manufacturing the COF structure provided by this embodiment of the present disclosure may refer to the steps of manufacturing the COF structure in the method for manufacturing any of display apparatuses provided by the embodiments of the present disclosure, which is not repeated in the embodiments of the present disclosure.

The method embodiments provided in the embodiments of the present disclosure can be cross-referenced with corresponding structure embodiments (such as the embodiments of the display apparatus, the display substrate, and the COF structure), which is not limited in the embodiments of the present disclosure. The sequence of the steps in the method embodiments provided by the embodiments of the present disclosure may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

It should be noted that in the accompanying drawings, for clarity of the illustration, the dimension of the layers and areas may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

Those skilled in the art should understand that the above descriptions are merely embodiments of the present disclosure, and are not intended to limit the present disclosure. Any modifications, equivalent substitutions or improvements that are made within the spirit and principle of the present disclosure should all be included in the protection scope of claims of the present disclosure.

What is claimed is:

1. A display apparatus, comprising:
   a base substrate;
   a bonding structure, disposed on the base substrate; and
   a chip-on-film (COF) structure, wherein the COF structure and a side of the bonding structure that is away from the base substrate are clamped with each other, and the COF structure is bonded to the side of the bonding structure that is away from the base substrate;
   wherein when the COF structure and the bonding structure are bonded, the COF structure contacts both a first surface and a second surface of the bonding structure at the side of the bonding structure that is away from the base substrate, wherein the first surface is parallel to the base substrate, and the second surface is at an angle with the first surface.

2. The display apparatus according to claim 1, wherein the bonding structure comprises a plurality of bonding pattern layers that are sequentially laminated on the base substrate and first insulating layers respectively disposed between each two adjacent bonding pattern layers;
   the COF structure comprises a plurality of COF layers that are sequentially laminated and second insulating layers respectively disposed between each two adjacent COF layers;
   the plurality of bonding pattern layers is in one-to-one correspondence with the plurality of COF layers, and a side of each bonding pattern layer that is away from the base substrate is bonded with a corresponding COF layer; and
   edges at the side of the plurality of bonding pattern layers that is away from the base substrate are arranged like a stair-step; the first surface comprises at least a part of an area of a surface of the bonding pattern layer that is away from the base substrate; and the second surface comprises at least one side surface of at least one bonding pattern layer.

3. The display apparatus according to claim 2, wherein for an $i^{th}$ bonding pattern layer and an $(i+1)^{th}$ bonding pattern layer sequentially arranged along a direction away from the base substrate among the plurality of bonding pattern layers, the $i^{th}$ bonding pattern layer protrudes beyond the $(i+1)^{th}$ bonding pattern layer, where $i \geq 1$.

4. The display apparatus according to claim 3, wherein a first orthographic projection is within a second orthographic projection, and an area of the first orthographic projection is smaller than an area of the second orthographic projection;
   the first orthographic projection is an orthographic projection of the $(i+1)^{th}$ bonding pattern layer on the base substrate, and the second orthographic projection is an orthographic projection of the $i^{th}$ bonding pattern layer on the base substrate.

5. The display apparatus according to claim 3, wherein the plurality of bonding pattern layers comprises a first bonding pattern layer and at least one second bonding pattern layer; the at least one second bonding pattern layer is disposed between the base substrate and the first bonding pattern layer; and the second bonding pattern layer comprises a first sub-pattern and a second sub-pattern spaced from each other, wherein both the first sub-pattern and the second sub-pattern are bonded with a COF layer corresponding to the second bonding pattern layer;

a side of a first sub-pattern of the $i^{th}$ bonding pattern layer away from a second sub-pattern of the $i^{th}$ bonding pattern layer protrudes beyond the $(i+1)^{th}$ bonding pattern layer, and a side of the second sub-pattern of the $i^{th}$ bonding pattern layer away from the first second sub-pattern of the $i^{th}$ bonding pattern layer protrudes beyond the $(i+1)^{th}$ bonding pattern layer.

6. The display apparatus according to claim 3, wherein for a first insulating layer between the $i^{th}$ bonding pattern layer and the $(i+1)^{th}$ bonding pattern layer, at at least one side of the $i^{th}$ bonding pattern layer, the $i^{th}$ bonding pattern layer protrudes beyond the first insulating layer, and the first insulating layer protrudes beyond the $(i+1)^{th}$ bonding pattern layer.

7. The display apparatus according to claim 6, wherein for the first insulating layer between the $i^{th}$ bonding pattern layer and the $(i+1)^{th}$ bonding pattern layer, at each of the at least one side, the first insulating layer protrudes beyond the $(i+1)^{th}$ bonding pattern layer for a length of smaller than or equal to 60 microns.

8. The display apparatus according to claim 7, wherein the length is larger than or equal to 20 microns and is smaller than or equal to 40 microns.

9. The display apparatus according to claim 2, wherein the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin; and the display apparatus further comprises a plurality of leads disposed on the base substrate, the at least one first pin of the bonding pattern layer is in one-to-one correspondence with the plurality of leads, and each first pin is connected to a corresponding lead.

10. The display apparatus according to claim 9, further comprising a connecting structure disposed on the base substrate, wherein at least part of the at least one first pin is connected to a lead corresponding to the first pin through the connecting structure.

11. The display apparatus according to claim 1, further comprising a flexible printed circuit (FPC) bonded with the COF structure, wherein a side of the COF structure away from the FPC is bonded with the bonding structure.

12. A method for manufacturing a display apparatus, comprising:
providing a base substrate and a chip-on-film (COF) structure;
forming a bonding structure on the base substrate; and
bonding the COF structure with a side of the bonding structure that is away from the base substrate, wherein the COF structure and the side of the bonding structure that is away from the base substrate are clamped with each other; wherein when the COF structure and the bonding structure are bonded, the COF structure contacts both a first surface and a second surface of the bonding structure at the side of the bonding structure that is away from the base substrate, wherein the first surface is parallel to the base substrate, and the second surface is at an angle with the first surface.

13. The method according to claim 12, wherein forming the bonding structure on the base substrate comprises:
forming a plurality of bonding pattern layers that are sequentially laminated on the base substrate and first insulating layers respectively disposed between each two adjacent bonding pattern layers, wherein edges at the side of the plurality of bonding pattern layers that is away from the base substrate are arranged like a stair-step; the first surface comprises at least a part of an area of a surface of the bonding pattern layer that is away from the base substrate; and the second surface comprises at least one side surface of at least one bonding pattern layer;

the COF structure comprises a plurality of COF layers that are sequentially laminated and second insulating layers respectively disposed between each two adjacent COF layers; the plurality of bonding pattern layers is in one-to-one correspondence with the plurality of COF layers; and bonding the COF structure with the side of the bonding structure that is away from the base substrate comprises:
bonding a side of each bonding pattern layer that is away from the base substrate with a corresponding COF layer.

14. The method according to claim 13, wherein the bonding pattern layer comprises at least one first pin; the COF layer comprises at least one second pin; the first pin of the bonding pattern layer is in one-to-one correspondence with the second pin of the COF layer;

bonding the side of each bonding pattern layer that is away from the base substrate with the corresponding COF layer comprises bonding a side of each first pin away from the base substrate with a corresponding second pin; and the method further comprises forming a plurality of leads on the base substrate, wherein the at least one first pin of the bonding pattern layer is in one-to-one correspondence with the plurality of leads, and each first pin is connected to a corresponding lead.

15. The method according to claim 14, further comprising: forming a connecting structure on the base substrate, wherein at least part of the at least one first pin is connected to a lead corresponding to the first pin through the connecting structure.

16. The method according to claim 12, further comprising:
providing a flexible printed circuit FPC; and
bonding the COF structure with the FPC, wherein a side of the COF structure away from the FPC is bonded with the bonding structure.

17. A chip-on-film (COF) structure, comprising a third surface and a fourth surface, wherein the third surface is at an angle with the fourth surface; the COF structure is configured to be bonded with a bonding structure that is away from a base substrate; the bonding structure is disposed on the base substrate; the COF structure and the side of the bonding structure that is away from the base substrate are clamped with each other; and when the COF structure and the bonding structure are bonded, both the third surface and the fourth surface contact the bonding structure.

18. The COF structure according to claim 17, wherein the bonding structure comprises a plurality of bonding pattern layers that are sequentially laminated on the base substrate and first insulating layers respectively disposed between each two adjacent bonding pattern layers;
the COF structure comprises a plurality of COF layers that are sequentially laminated and second insulating layers respectively disposed between each two adjacent COF layers;
the plurality of bonding pattern layers is in one-to-one correspondence with the plurality of COF layers, and a side of each bonding pattern layer that is away from the base substrate is bonded with a corresponding COF layer.

19. The COF structure according to claim 18, wherein the bonding pattern layer comprises at least one first pin; the COF layer comprises at least one second pin; the first pin of the bonding pattern layer is in one-to-one correspondence with the second pin of the COF layer; and a side of each first pin away from the base substrate is bonded with a corresponding second pin.

* * * * *